(12) United States Patent
Mertelmeier et al.

(10) Patent No.: US 6,710,686 B2
(45) Date of Patent: Mar. 23, 2004

(54) METHOD FOR THE FAST ACQUISITION OF A MAGNETIC RESONANCE IMAGE

(75) Inventors: Thomas Mertelmeier, Erlangen (DE); Arnulf Oppelt, Spardorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/126,288

(22) Filed: Apr. 19, 2002

(65) Prior Publication Data

US 2002/0175683 A1 Nov. 28, 2002

(30) Foreign Application Priority Data

Apr. 20, 2001 (DE) .......................................... 101 19 660

(51) Int. Cl.$^7$ ................................................ G01V 3/00
(52) U.S. Cl. .................................................. 334/314
(58) Field of Search ............................... 324/307, 309, 324/318, 322, 314; 600/410, 422, 420

(56) References Cited

U.S. PATENT DOCUMENTS

| | | | | | |
|---|---|---|---|---|---|
| 5,218,299 | A | * | 6/1993 | Dunkel ........................ | 324/307 |
| 5,479,924 | A | * | 1/1996 | Navon et al. ................ | 600/410 |
| 5,652,513 | A | * | 7/1997 | Liu et al. ..................... | 324/306 |
| 5,722,410 | A | * | 3/1998 | NessAiver ................... | 600/422 |
| 5,742,163 | A | * | 4/1998 | Liu et al. ..................... | 324/309 |
| 5,881,728 | A | * | 3/1999 | Mistretta et al. ............ | 600/420 |
| 5,910,728 | A | * | 6/1999 | Sodickson ................... | 324/309 |
| 6,144,873 | A | * | 11/2000 | Madore et al. .............. | 600/410 |
| 6,289,232 | B1 | * | 9/2001 | Jakob et al. ................. | 600/410 |
| 6,366,092 | B1 | * | 4/2002 | Ehnholm et al. ............ | 324/309 |
| 6,377,045 | B1 | * | 4/2002 | Van Den Brink et al. .. | 324/307 |
| 6,380,741 | B1 | * | 4/2002 | Hajnal et al. ................ | 324/318 |
| 6,396,269 | B1 | * | 5/2002 | Hajnal et al. ................ | 324/307 |
| 6,476,606 | B2 | * | 11/2002 | Lee ............................. | 324/309 |
| 6,518,760 | B2 | * | 2/2003 | Fuderer et al. .............. | 324/307 |
| 6,556,009 | B2 | * | 4/2003 | Kellman et al. ............. | 324/309 |

OTHER PUBLICATIONS

"Simultaneous Acquisition of Spatial harmonics (SMASH): Fast Imaging with Radiofrequency Coil Arrays," Sodickson et al., Magnetic Resonance in Medicine, vol. 38, (1997) pp. 591–603.
"SENSE: Sensitivity Encoding for Fast MRI,"Pruessmann et al., Magnetic Resonance in Medicine, vol. 42, (1999) pp. 952–962.
"Partially Parallel Imaging With Localized Sensitivities (PILS)," Griswold et al., Magnetic Resonance in Medicine, vol. 44 (2000), pp. 602–609.

* cited by examiner

Primary Examiner—Diego Gutierrez
Assistant Examiner—Dixomara Vargas
(74) Attorney, Agent, or Firm—Schiff Hardin & Waite (57) ABSTRACT

In a method for the fast acquisition of a magnetic resonance image, magnetic resonance signals from an imaging region are conditioned with magnetic gradient fields that define a spatial frequency space so that the spatial frequency domain is occupied with magnetic resonance signals having trajectories that are radially directed and proceed through a projection center, and the imaging region is divided into sub-regions with an antenna of an antenna array respectively allocated to each sub-region. The antennas have respective positions relative to the projection center such that the antennas simultaneously receive the magnetic resonance signals and form reception signals from the magnetic resonance signals according to their sensitivity. The number of radially directed trajectories is of only such a size so that the sub-zones regardless of their spatial position in the imaging zone from the respective reception signals can be unambiguously reconstructed. The reception signals of the individual antennas, taking the positions of the individual antennas into consideration, are transformed in a transformation step to form a magnetic resonance image of the entire imaging zone.

21 Claims, 9 Drawing Sheets

METHOD FOR THE FAST ACQUISITION OF A MAGNETIC RESONANCE IMAGE

BACKGROUND OF THE INVENTION

1. Field of the Invention

The present invention is directed to a method for the fast acquisition of a magnetic resonance image, wherein magnetic resonance signals from an imaging region are acted on by magnetic gradient fields that define a spatial frequency space so that the spatial frequency space is occupied with magnetic resonance signals having trajectories that are radially directed and proceed through a projection center.

2. Description of the Prior Art

A method of the above type is described in the book by Heinz Morneburg, "Bildgebende Systems für die medizinische Diagnostik," Publicis MCD Verlag, $3^{rd}$ edition, 1995, pages 176–183.

The localization of the magnetic resonance signals from a subject to be imaged that is necessary for the imaging ensues by superimposition of a uniform magnetic basic field with a magnetic field gradient. When a two-dimensional examination subject is assumed wherein the magnetization aligned by the basic magnetic field was tilted out of the equilibrium position by means of a radio-frequency pulse, then the Larmor frequency is constant in stripes perpendicular to the gradient direction when a gradient field is applied. In other words, the signal amplitude of the magnetic resonance signal as a function of the frequency respectively corresponds to the sum of all spins in this stripe, i.e. represents the projection of the transverse magnetization onto the field gradient. The signal that is detected by the measurement, however, is the time signal that is registered by means of suitable antennas. During further processing, an alternating voltage similar to the Larmor frequency is admixed with the received magnetic resonance signal, so that the signal of the difference frequency (phase-sensitive rectification) directly indicates the magnetic moment of the precessing nuclear magnetization. With the introduction of a "normalized time" or spatial frequency k established by $k=\gamma \int G \cdot dt$, where $\gamma$ is the gyromagnetic ratio, G is the magnetic field gradient and t is the time during which the magnetic field gradient is superimposed on the magnetic basic field, the measured signal and the projection prove to be a Fourier transform pair. A set of magnetic resonance signals that are generated in successively stepped gradients is, accordingly, the two-dimensional Fourier transform of the magnetization. The Fourier space, spatial frequency domain or k-space inverse to the spatial or image domain wherein the test subject is located is thus scanned with a raster of polar coordinates. The graphic presentation of the magnetization, however, ensues in Cartesian coordinates. The magnetic resonance image then can be generated with two different methods. In the first method, the received magnetic resonance signals are re-interpolated onto a Cartesian grid and are subjected to a two-dimensional Fourier transformation. In a second method, the received magnetic resonance signals are subjected to a one-dimensional Fourier transformation, as a result of which projections are calculated and the image is then reconstructed by means of a filtered back-projection.

For imaging three-dimensional subjects, the above considerations for two-dimensional imaging are expanded by one dimension. When it is assumed in the two-dimensional case that N projections are registered, $N^2$ projections must be registered in the three-dimensional case given the same resolution in the third dimension. If it is desired to avoid the lengthening on the measurement time resulting therefrom and to graphically present only one slice, this slice is cut (defined) from the spatial test subject by means of "selective excitation", this then being two-dimensionally measured.

The radial scanning of the spatial frequency domain mentioned above is of interest for magnetic resonance imaging because it enables shorter repetition times in the image sequence compared to the occupation of the spatial frequency domain in Cartesian coordinates and is less susceptible to motion artifacts. The shortening of the repetition time arises from the absence of the additional phase coding steps required given Cartesian scanning directions.

Various other methods are known in general for reducing the exposure times in magnetic resonance imaging that are based on parallel and simultaneous data pickup of the magnetic resonance signals with a number of antennas of an antenna array (PPA, or partial parallel acquisition, methods). The number of lines in the spatial frequency domain to be acquired thus can be reduced in conformity with the number of antennas utilized.

One such method is described in the article by Daniel K. Sodicksen, Warren J. Manning, "Simultaneous Acquisition of Spatial Harmonics (SMASH): Fast Imaging with Radiofrequency Coil Arrays", which appeared in Magnetic Resonance in Medicine, Volume 38, 1997, pages 591 through 603. The location coding or conditioning of the spins therein ensues with phase coding gradients and frequency coding gradients. The spatial frequency space is thus scanned on a Cartesian grid. The magnetic resonance signals, however, are conditioned such that scanning in phase coding direction is only incomplete. The excited magnetic resonance signals, however, are simultaneously received with an antenna array composed of a number of antennas. Because the individual k-space rows are multiplied by weighting factors that are determined from the sensitivity profiles of the antennas (which are assumed to be known), the missing k-space rows can be synthesized, so that k-space is completed in the phase coding direction. A gain in measuring time thus is achieved that corresponds to the phase coding steps that are saved.

The article by Klaas P. Pruessmann, Markus Weiger, Markus B. Scheidecker and Peter Boesiger, "Sense: Sensitivity Encoding for Fast MRI", which appeared in Magnetic Resonance in Medicine, Volume 42, 1999, pages 952 through 962, describes a PPA method wherein the signals received from the individual antennas, that are incomplete in the phase coding direction, are first subjected to a Fourier transformation. The partial images that are generated in this way, however, exhibit convolutions in the phase coding direction due to the under-scanning. The individual images are then superimposed form a convolution-free overall image using the known sensitivity profiles.

The article by Mark A. Griswold, Peter M. Jakob, Mathias Nittka, James W. Goldfarb and Axel Haase, "Partially Parallel Imaging With Localized Sensitivities (PILS)", which appeared in Magnetic Resonance in Medicine, Volume 44, 2000, pages 602–609, describes a further PPA method. It is thereby assumed that the individual antennas in the antenna array have only a limited sensitivity profile. It is then adequate for the antennas to be characterized by only two parameters: the position of the center of the sensitivity zone of the corresponding antenna in the overall field of view and the width of the sensitivity zone around this center.

SUMMARY OF THE INVENTION

An object of the present invention is based on the object of specifying a method for fast acquisition of a magnetic resonance image wherein the measuring time that has already been inherently shortened is reduced further given radial scanning of the spatial frequency space.

This object is achieved in a method in accordance with the invention wherein the imaging zone is subdivided into sub-regions; with an antenna of an antenna array allocated to each sub-region. Each antenna has a known position relative to the projection center; and the antennas simultaneously receive the magnetic resonance signals and respectively form reception signals from the received magnetic resonance signals according to their sensitivity. The number of radially directed trajectories is of such a size so that only the sub-zones—regardless of their spatial position in the imaging zone—can be unambiguously reconstructed; from the respectively received signals. The reception signals, taking the positions of the individual receiving antenna into consideration, are transformed in a transformation step to form a magnetic resonance image of the entire imaging zone. The sampling increment along the trajectories for the signals of the individual antennas in k-space is always selected so small, i.e. the number of sampling steps is made so large, that a circle is selected having a diameter that is at least of such a size that the projections of the subject to be imaged fit therein, i.e. it can be presented without fold-overs or clipping. Below, this circle is called the overall image field. The reduction of the measurement time is achieved because—given the same resolution—fewer trajectories in k-space are required due to the simultaneous reception of magnetic resonance signals with a number of antennas from sub-zones that are smaller than the overall imaging zone, compared to the situation where the entire imaging zone is covered with a single antenna. Due to the smaller sub-zones compared to the overall imaging zone, each antenna of the antenna array also receives less noise, so that a better signal-to-noise ratio also is achieved with reference to the measurement time.

In on embodiment, respective projections are formed in the transformation step by a Fourier transformation from the reception signal of the antennas, whose number of angular steps, of course, is reduced in comparison to the number of angular steps that would be required for imaging the overall zone with one coil. The respective projections are back-projected into the imaging zone to form partial images after a filtering. Due to the reduced number of projection steps, each partial image is surrounded by ray-shaped reconstruction artifacts that can be cut off (suppressed) before superimposition of the partial images without loss of information when the position of the individual antennas is known. This is an important calculating step and is the reason why it is advantageous to first reconstruct individual images that are later superimposed. If the signals of the individual coils were not superimposed until they are in k-space and the overall image were then reconstructed in one calculating step, the sampling artifacts that occur due to the reduced number of projection steps could not be removed without further difficulty.

In another embodiment, the reception signals of the individual antennas established on the radial projectories in the spatial frequency domain are transformed in the transformation step onto a rectangular grid, and the partial images allocated to the antennas are reconstructed with a two-dimensional Fourier transformation from the reception signals transformed onto the rectangular grid. It must likewise be taken into consideration that the partial images are surrounded by over-convolution artifacts that must be removed before the superimposition to form the magnetic resonance image.

In another embodiment, the projections obtained by means of the Fourier transformation of the signal values are shifted from the position of the antenna into the projection center before the filtered back-projection, i.e. the origin of the gradient directions. The partial image reconstruction then need not ensue in the overall image field but instead be made in a smaller image field, and the clipping of over-convolution artifacts can be omitted. As a result, the reconstruction time can be shortened. For formatting the overall image, the partial images are again shifted back to the position of the antenna and superimposed.

In another embodiment, the reception signals of the antennas are reinterpolated onto a rectangular grid and are then multiplied by a phase factor derived from the distance of the respective antenna from the projection center. The partial images obtained after two-dimensional Fourier transformation are shifted back again corresponding to the positions of the antennas and are superimposed to form the overall image. A shift is utilized is a shift in the locus or image domain in the Fourier space corresponding to an additional phase in the spatial frequency domain.

In a further embodiment uses a technique similar to the SMASH method, wherein a completely occupied spatial frequency domain of the imaging zone is generated from the reception signals and the sensitivity profiles of the antennas with linear combinations in the transformation step, and in that the magnetic resonance image is reconstructed from the completely occupied spatial frequency domain. The reconstruction to form the overall image ensues by calculating projections by Fourier transformation from the signals that are back-projected filtered, or the signals are re-interpolated onto a rectangular grid and the overall image is acquired by a two-dimensional Fourier transformation. The weighting factors for the linear combinations are selected such that azimuthally harmonically varying functions are built up from the known sensitivity profiles.

In another version of the above-described reconstructions, the partial images are superimposed in a weighted manner. The weighting factors can be selected to achieve a particular result. For example, the weighting factors can be selected so that the variation of the image signal arising due to different sensitivities of the individual coils is compensated, or by weighting the partial images dependent on their own signal content before their superimposition. Using the latter technique, a quality improvement of the magnetic resonance image is achieved because the useful signals with high amplitude are more highly weighted in comparison to noise signals with low amplitude in the superimposition.

In another embodiment, an arbitrarily shaped imaging zone is simulated by round sub-zones in order to thus be able to utilize the advantageous of radial scanning.

The sub-zones then can partially overlap in a version of this embodiment.

Fundamentally, an approximately spherical subject also can be radially scanned in k-space with a coil array and measurement time for the acquisition of a 3D image can be saved by division into partial measuring fields. For the acquisition of individual images, however, it is more beneficial to select a slice from the imaging zone by means of a magnetic gradient field during the RF excitation.

DESCRIPTION OF THE PREFERRED EMBODIMENTS

Figure 1:
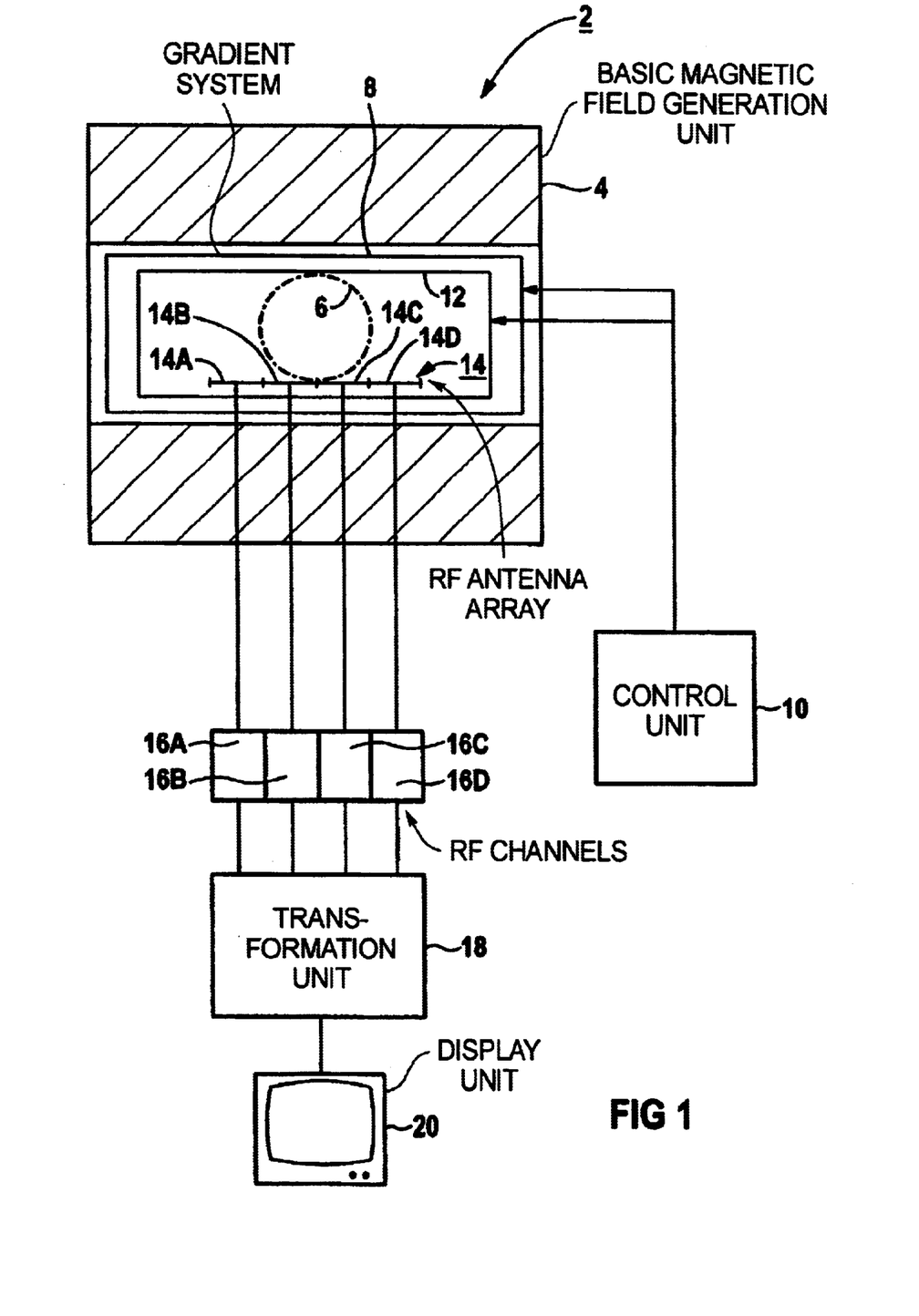
FIG. 1 schematically illustrates the basic components of a diagnostic magnetic resonance apparatus for implementing the inventive method.
Figure 2A:
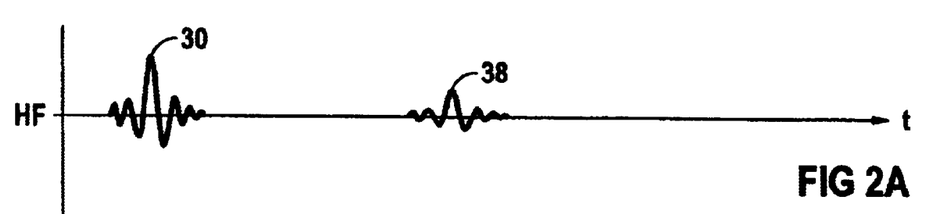
FIGS. 2A through 2D illustrate a pulse sequence for occupying the spatial frequency domain along radially directed trajectories (radial k-space sampling) in the inventive method.
Figure 2B:
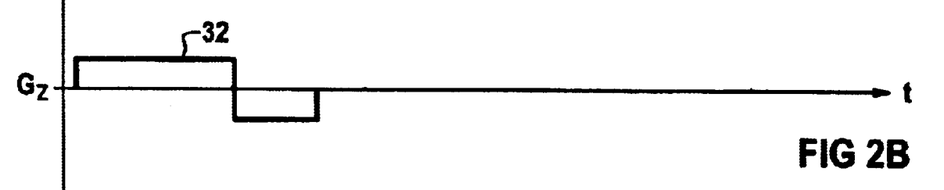
Figure 2C:
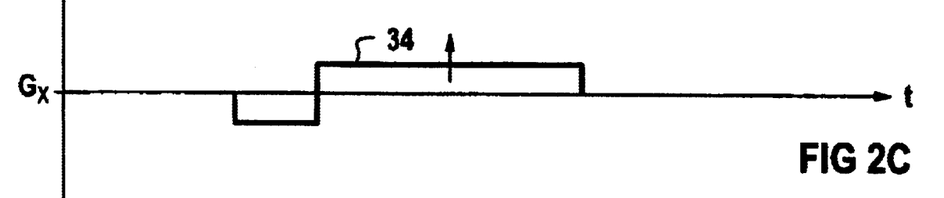
Figure 2D:
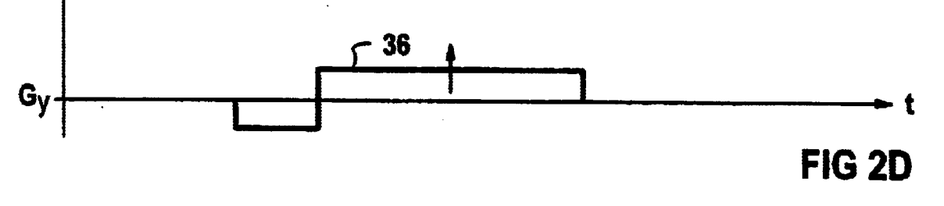

FIG. 1 schematically shows a diagnostic magnetic resonance apparatus 2 having a basic magnetic field generation unit 4 for generating a uniform magnetic field in an imaging volume 6, a gradient system 8 for generating magnetic gradient fields in three spatial directions residing perpendicularly to one another, a radio-frequency antenna system for the excitation and for the reception of magnetic resonance signals, as well as a control unit 10 for controlling the individual components in the magnetic resonance apparatus. The magnetic gradient fields are activated with a predetermined intensity for location coding of the magnetic resonance signals dependent on a selected sequence, being activated at predetermined time intervals. For most sequences employed, a distinction is made between a slice selection gradient, a phase coding gradient and a frequency coding gradient. In the inventive method, however, a phase coding gradient is not used; instead, only one frequency coding gradient is used, and possibly a slice selection gradient if the nuclear spins in only one slice are to be excited.

The radio-frequency antenna system includes a whole body antenna 12 that is fashioned both for the excitation as well as for the reception of the magnetic resonance signals. In addition, an antenna array 14 having individual antennas 14A, 14B, 14C, 14D independent of one another is present, which, in contrast to the whole body antenna 12, are capable of imaging only a limited zone. This is utilized in the inventive fast magnetic resonance imaging method with parallel data acquisition, whereby an under-scanning ensues in the spatial frequency domain, and thus measuring time is saved. The individual antennas 14A, 14B, 14C, 14D are respectively connected to independent radio-frequency channels 16A, 16B, 16C, 16D wherein an amplification, a phase-sensitive demodulation and a digitization of the magnetic resonance signals received from the individual antennas 14A, 14B, 14C, 14D ensues.

A transformation unit 18 is provided in order to generate a magnetic resonance image of the overall imaging zone from the digitized reception signals of the individual antennas 14A, 14B, 14C, 14D, as explained below. This magnetic resonance image is able to be presented on a display unit 20.

FIG. 2A, FIG. 2B, FIG. 2C and FIG. 2D in combination show a sequence for radial scanning of the spatial frequency domain as an example. Simultaneously with a radio-frequency excitation pulse 30 (FIG. 2A), a slice selection gradient 32 (FIG. 2B) is activated in order to select only one slice to be imaged from the overall imaging zone as tomogram. Employed here as the slice selection gradient is a gradient $G_z$ in the z-direction of a rectangular xyz-coordinate system. The slice selection, however, can ensue alternatively with other gradient directions dependent on the position and alignment of the slice. Subsequently, two gradient fields oriented perpendicularly to the z-direction and also oriented perpendicularly to one another are activated by pulses 34 and 36, as a field $G_x$ in the x-direction and 36 as a field $G_y$ in y-direction, respectively. Their sum defines a projection direction of the reception signal 38 that then arises. After each subsequent radio-frequency excitation pulse, the spins are somewhat differently conditioned, so that a new projection direction arises that is rotated by an angle relative to the preceding projection direction. All projections proceed through a projection center that is defined by the location at which the magnetic projection gradient causes no magnetic field variation at each projection direction.

According to the sampling theorem, the length and the number of radial sampling trajectories in k-space defines the topical resolution δ that can be achieved in the reconstructed image. The required length of the trajectories measured from the zero point of k-space is $k_{max}=\pi/\delta$, and the necessary angular increment Δ between neighboring trajectories is Δ=2D/δ, whereby D indicates the diameter of the subject to be imaged. It can be seen that, given the same topical resolution δ, larger angular steps Δ are possible given a subject with a small diameter then given a subject with a large diameter. The number of angular steps N=π/Δ required for an image reconstruction thus can be reduced given a small subject.

The spacing of the sampling points for the magnetic resonance signals on the trajectory ensues at Δk=2π/D.

Figure 3:
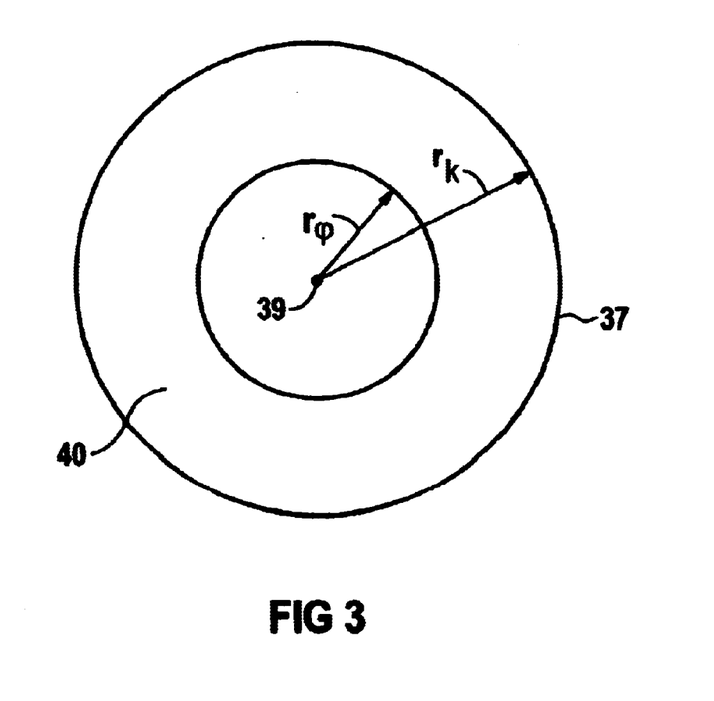
FIG. 3 illustrates a point image function with which a subject to be imaged is convolved in the imaging in the inventive method.
Figure 4:
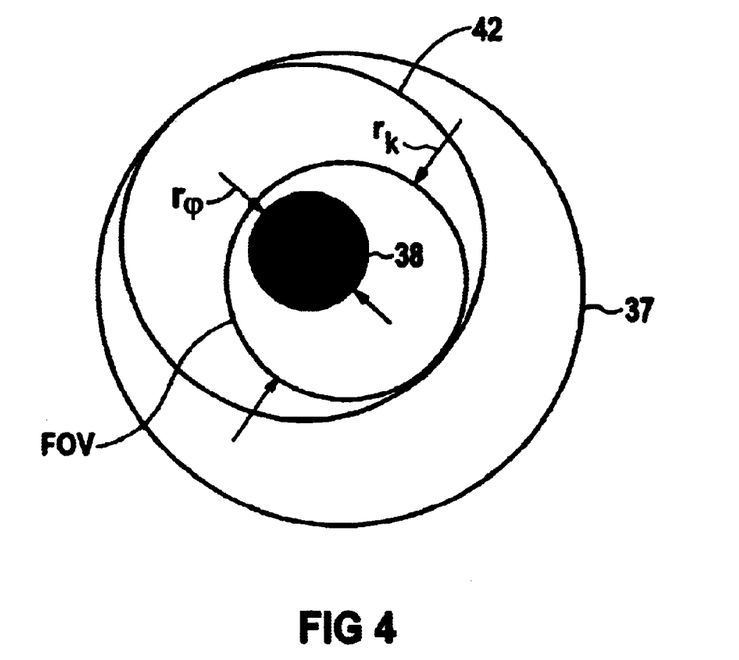
FIG. 4 illustrates an example of how a small subject is presented in a field of view, the small subject being scanned with a reduced number of k-space trajectories in the inventive method.

The factors which are taken into consideration in the inventive method are explained in detail in FIG. 3 and in FIG. 4. FIG. 4 shows the point image function with which a subject to be imaged is convolved in the imaging and that is derived from the two-dimensional Fourier transform of the sampling grid in k-space. FIG. 4 shows an example of how a small subject is presented in a field of view, the small subject being scanned with a reduced number of k-space trajectories. The scanning of the measured signals in the k-space corresponds to a convolution of the measurement subject in the spatial domain with the Fourier transform of the sampling function in k-space. Given radial scanning in k-space and when the sampling theorem is satisfied in the radial and azimuthal directions, the sampling function in the spatial domain within a circle 37 having the radius $r_k=1/\Delta k$ is a point subject 38 in the zone with a radius $r_k/2$, the field of view (FOV) can be presented with a resolution δ without over-convolutions up to a radius of a maximum of $r_k/2$, this resolution being established by the length of the sampling trajectories $k_{max}=\pi/\delta$ in k-space.

When the sampling theorem is not azimuthally satisfied, i.e. Δ is greater than 4π/(Δk·δ), the sampling function in the spatial domain within the radius $r_k=1/\Delta k$ is a point 39 that, beginning with the smaller radius $r=4\pi/\Delta k^2 \delta\Delta$, is surrounded by a ring 40 having ray-shaped over-convolutions. Subjects in the zone having the diameter $r_k$ can be reconstructed without inner over-convolution artifacts up to a radius of r/2. Over-convolution artifacts arise in a zone 42 outside the reconstructed subject.

The over-convolution artifacts can be blanked out with a filter operation.

Figure 5:
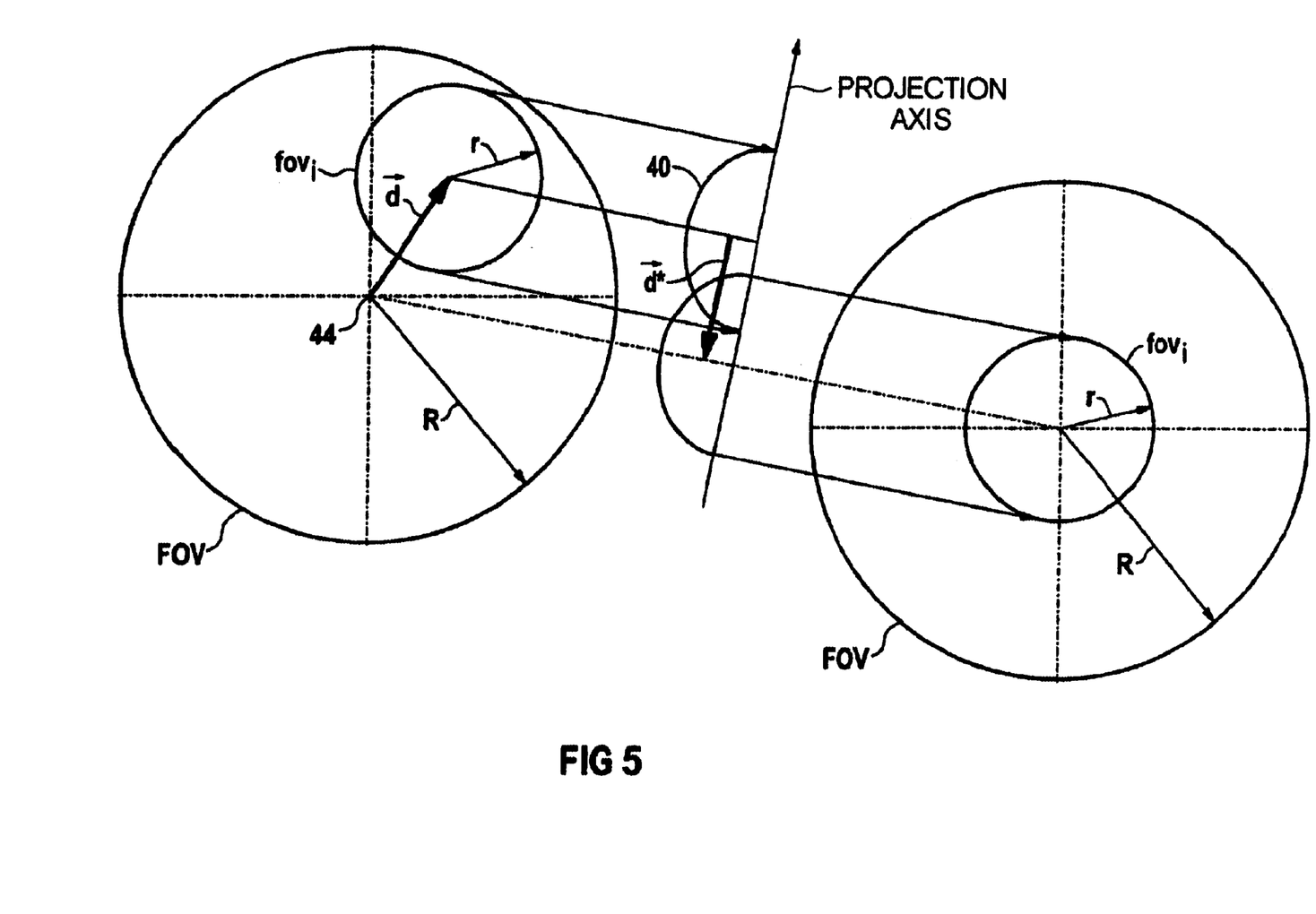
FIG. 5 is an illustration of a coordinate transformation of the projections in the inventive method.

Alternatively, the partial images can be reconstructed in a smaller region than $r_k$, as shall be explained with reference to FIG. 5. When the position of a partial imaging zone $fov_i$ is characterized by a location vector d and the size of the partial imaging zone $fov_i$ is characterized by a radius vector r, a projection 40 of the $fov_i$ must be transformed into the projection center 44 so that the above-explained sampling conditions for an unambiguous reconstruction are met. The transformation is described by a shift vector d* that is derived from a projection of the vector d onto the projection axis.

Since a shift in the image domain corresponds to an additional phase in the Fourier domain, the coordinate transformation can already be implemented in the spatial frequency domain by multiplying the reception signals by a phase factor exp(idk), wherein i denotes the square root of −1, d denotes the position of the mid-point of the partial imaging zones $fov_i$ and k denotes the spatial frequency that was already initially indicated.

Figure 6:
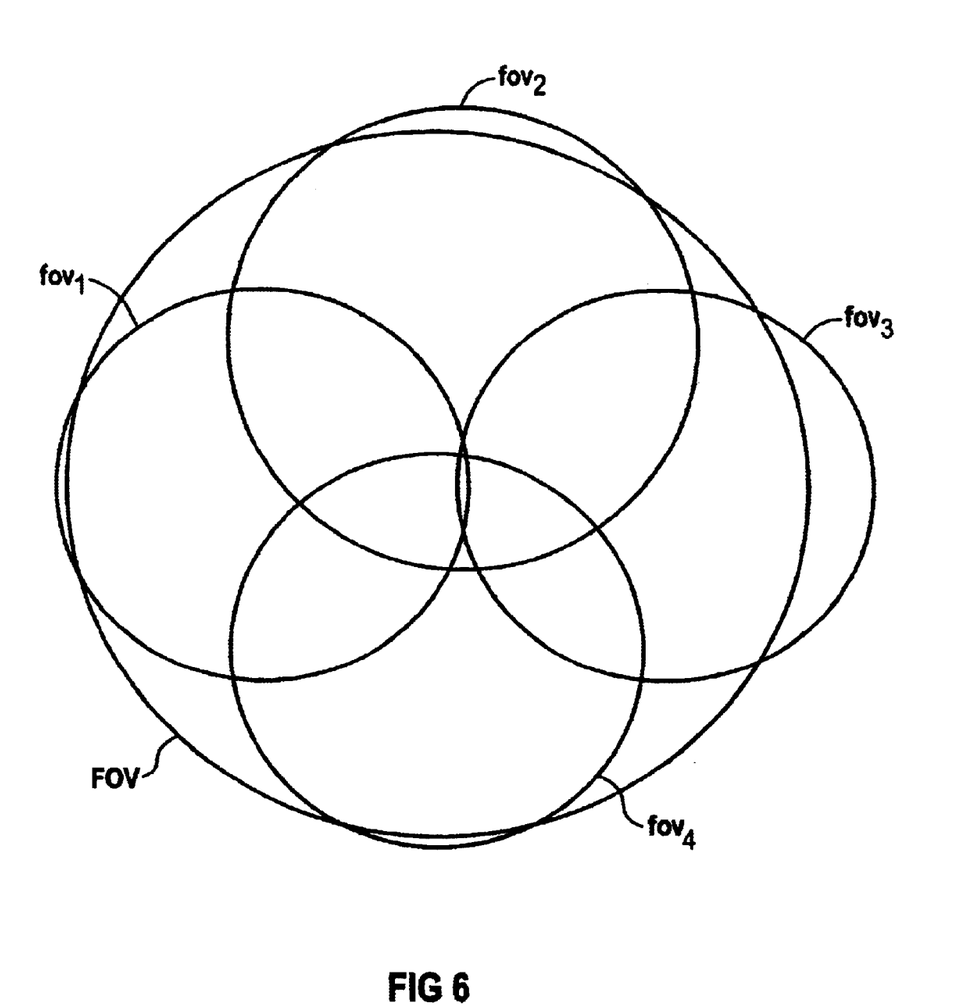
FIG. 6 shows a division of the imaging zone into sub-imaging zones in the inventive method.

As shown in FIG. 6, the division of the imaging zone FOV into partial imaging zones $fov_i$ in the inventive method ensues by means of the individual antennas 14A, 14B, 14C, 14D of the antenna array 14. The individual antennas 14A, 14B, 14C, 14D primarily receive signals from their allocated partial imaging zones $fov_1$, $fov_2$, $fov_3$ and $fov_4$ corresponding to their sensitivity profile. A certain overlap of the partial imaging zones $fov_i$ is thereby of no significance. However, it is especially beneficial for a uniform coverage of the imaging zone FOV to select a concentric arrangement of the antennas 14A, 14B, 14C, 14D . . . of 7, 19, 37, etc. antennas, according to the strategy 1+2·6+3·6. This corresponds to an arrangement of six antennas around a central antenna on a first circle having an angular spacing of 60°; 12 antennas having a spacing of 30° arranged around a second circle, etc.

Figure 7:
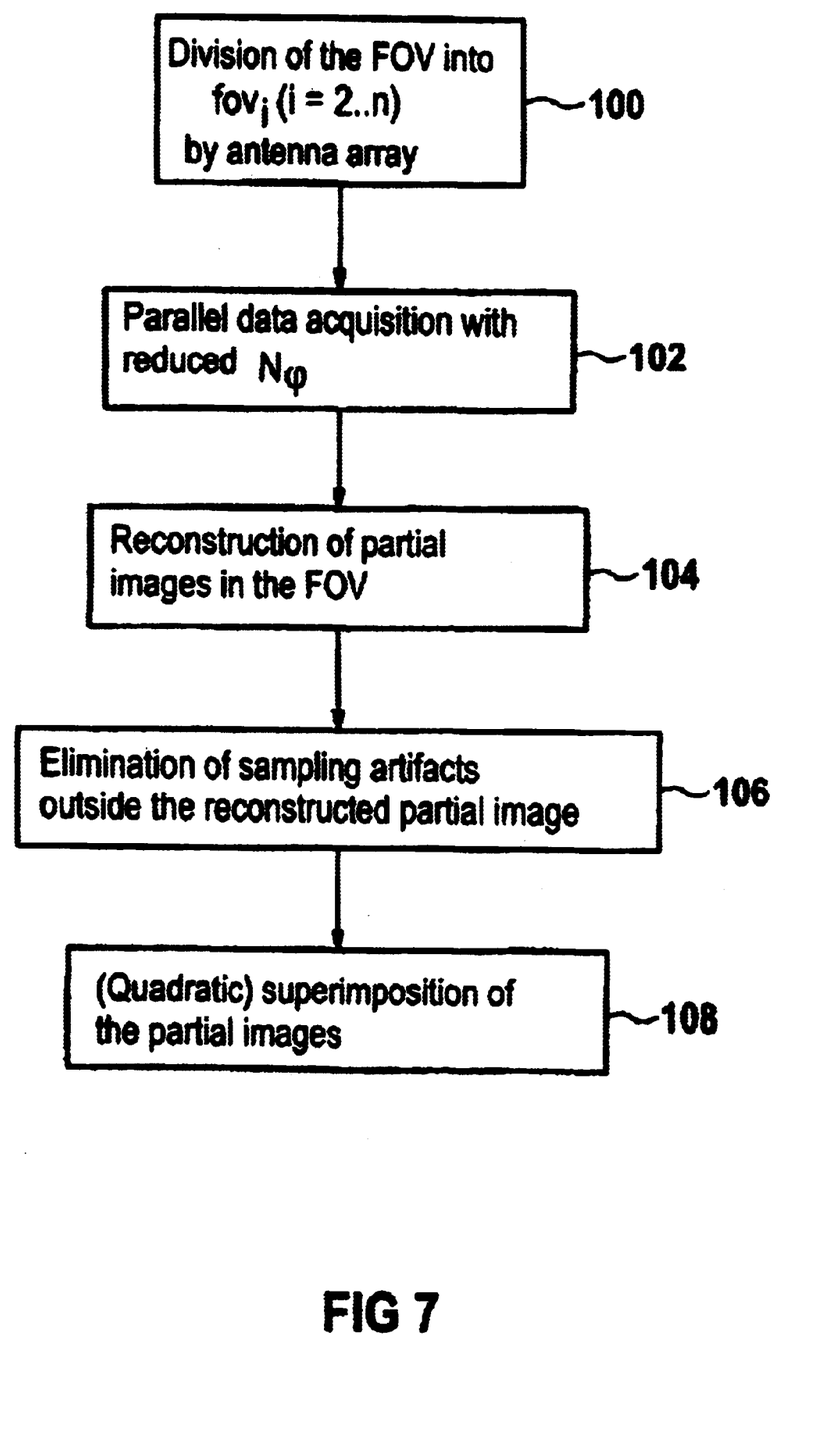
FIG. 7 is a schematic illustration of a first embodiment of the inventive method for fast image acquisition.

The basic method steps of a first embodiment of the invention are presented in a brief overview in FIG. 7. Further considerations regarding the practical implementation follow from the above background discussion. With a given imaging zone FOV, a suitable antenna array is employed with which the imaging zone FOV is divided into sub-imaging zones $fov_i$ (Step 100), these being established by the sensitivity profiles of the antennas 14A, 14B, 14C, 14D. In Step 102, a data acquisition subsequently ensues with a suitable sequence that radially samples the spatial frequency domain. The number N of required projections follows from the size of the partial imaging zones $fov_i$. In a Step 104, partial images are then reconstructed in the imaging zone FOV, either by filtered back-projection or by a re-griding and a subsequent two-dimensional Fourier transformation. As was already explained above, the partial images are surrounded by sampling artifacts that are eliminated in a Step 106. For this purpose, the positions of the antennas and their sensitivity profiles are employed. Only image signals are allowed in the partial imaging zones $fov_i$ wherein the coil sensitivities have not dropped below half the value of the maximum sensitivities. In a Step 108, the partial images are then quadratically superimposed. In a quadratic superimposition, pixel values of the partial images that correspond to one another are initially squared, then added and, subsequently, the square root of the sum of the squares is then taken. This ensues pixel-by-pixel and thus yields the pixel values of the magnetic resonance image that are presented on the display 20. As warranted, the partial images are also normalized before the superimposition according to the sensitivity profiles of the antennas. The Steps 104 through 108 are implemented in the transformation unit 18 that is realized in practice with a program-controlled computer system.

Figure 8:
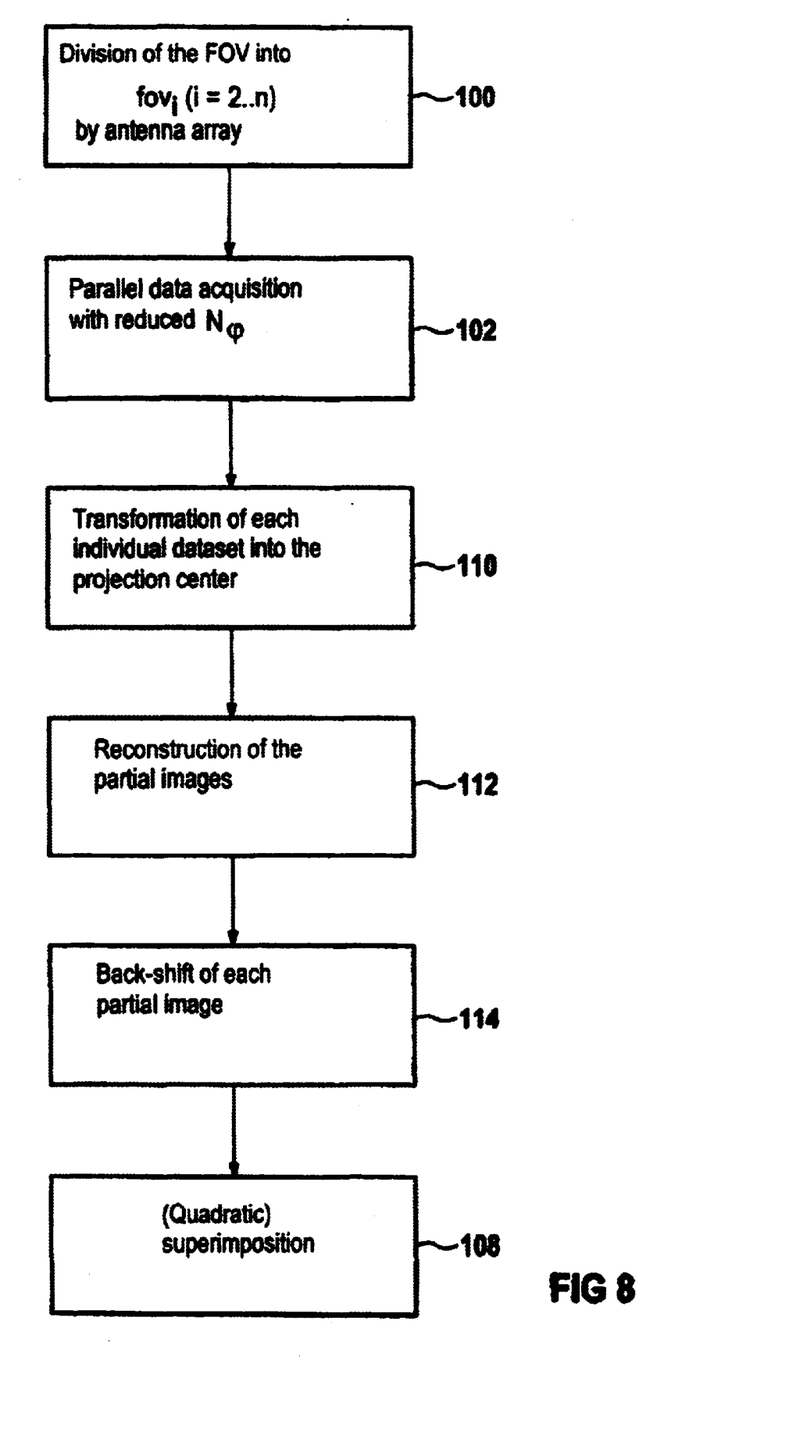
FIG. 8 is a schematic illustration of a second embodiment of the inventive method for fast image acquisition.

Fig. shows the basic method steps of a second embodiment of the invention in a succinct overview. Further considerations relating to the practical implementation likewise follow from the above background discussion. The Steps 100 and 102 correspond to the method steps with the same reference characters already explained with reference to FIG. 7. In a further Step 110, the data sets acquired with the individual antennas 14A, 14B, 14C, 14D are transformed (shifted) into the projection center corresponding to the distance of the antennas 14A, 14B, 14C, 14D from the projection center. In Step 112, partial images respectively allocated to the antennas 14A, 14B, 14C, 14D are reconstructed from the transformed data sets. After a back-shift of the partial images in Step 14 to the position prescribed by the corresponding antenna 14A, 14B, 14C, 14D, the location-proper quadratic superimposition of the partial images to form the magnetic resonance image ensues in Step 108.

Figure 9:
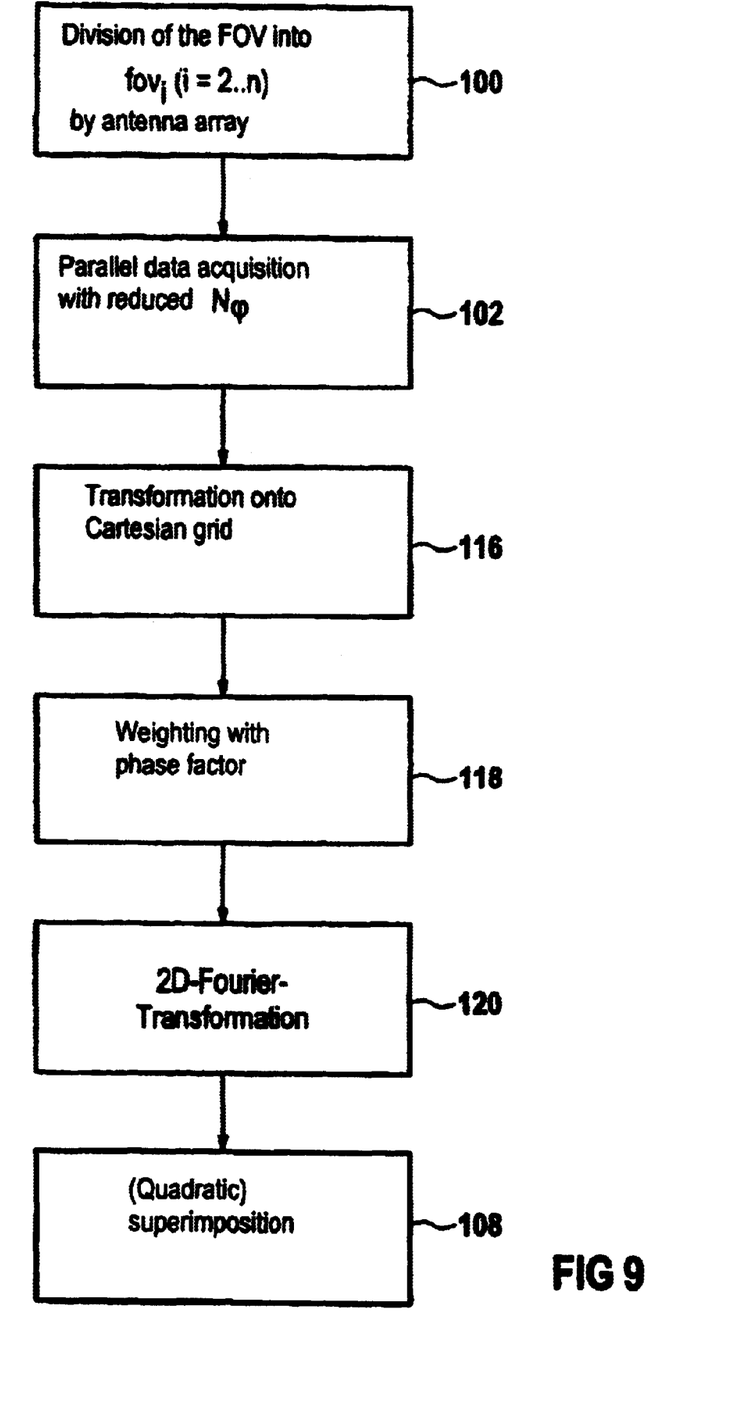
FIG. 9 is a schematic illustration of a third embodiment of the inventive method for fast image acquisition.

The basic steps of a third embodiment shall be explained on the basis of FIG. 9. Further considerations regarding the practical implementation thereof likewise follow from the earlier background discussion. Steps 100 and 102 correspond to the first embodiment described on the basis of FIG. 7. The data sets of the individual antennas 14A, 14B, 14C, 14D that are present in the spatial frequency domain, however, are transformed onto a Cartesian grid here in Step 116 (regridding). The different positions of the individual $fov_i$ are taken into consideration in Step 118 by a weighting of the data sets with the phase factor prescribed by the position. These transformed data sets are then subjected to a 2D Fourier transformation in Step 120. The Fourier-transformed data sets of the partial zones are then again superimposed quadratically to form the magnetic resonance image (Step 108). The Steps 108 and 116 through 120 are implemented in the transformation unit 18.

Figure 10:
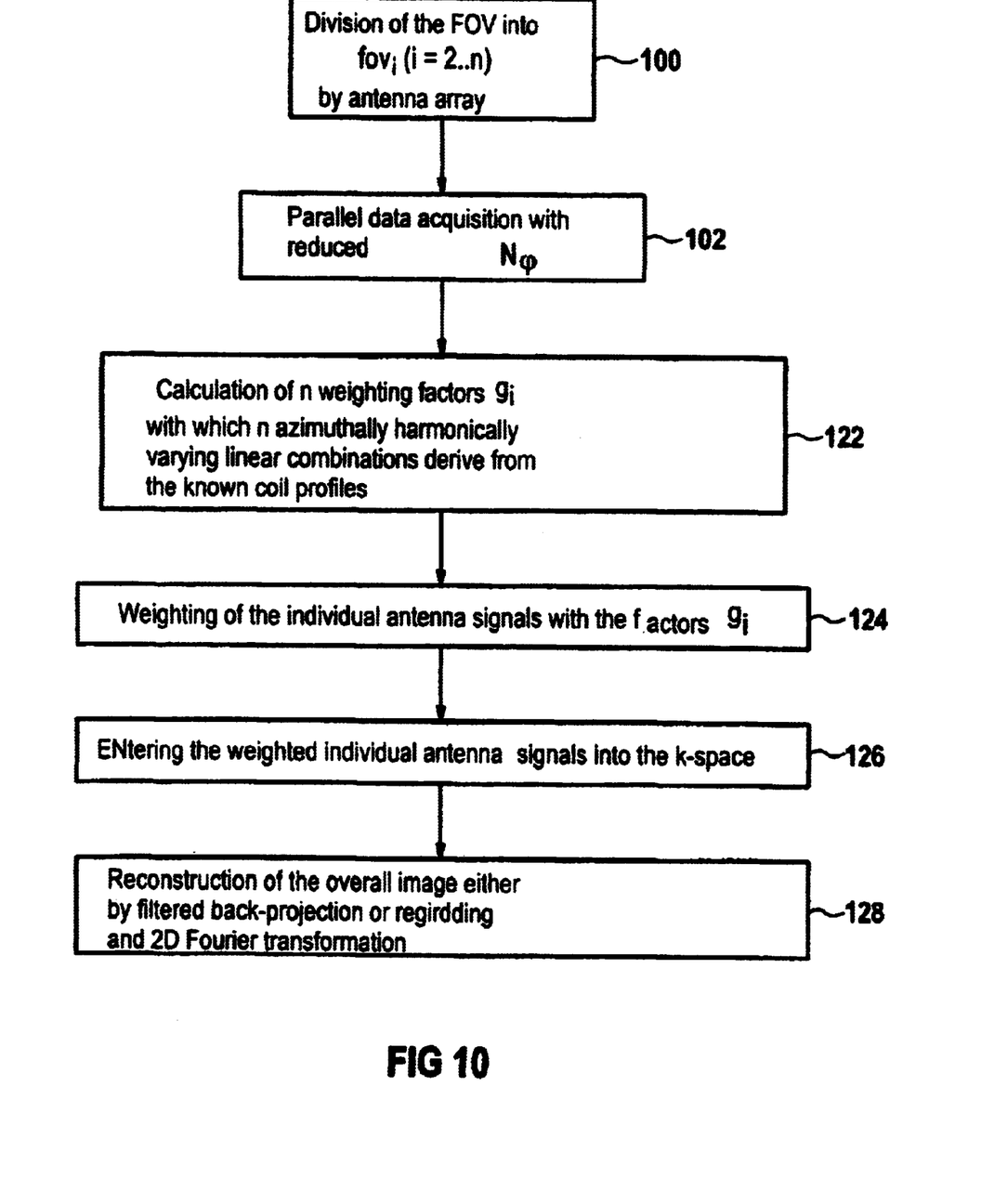
FIG. 10 is a schematic illustration of a fourth embodiment of the inventive method for fast image acquisition.

The basic steps of a fourth exemplary embodiment are shown in FIG. 10. In this exemplary embodiment, the reconstruction from the radial projection ensues using spatial harmonics. It is thereby a pre-condition that the sensitivity profiles of the antennas 14A, 14B, 14C, 14D can be superimposed such that the combined sensitivity function of all antennas is harmonic with respect to the rotational angle around the projection center. This can be easily realized given an arrangement of the array 14 around the imaging zone FOV. Even in the case of a (more likely) a planar arrangement, the presumed overall sensitivity function can be realized; the FIT algorithm to be applied is then potentially more complicated. The Steps 100 and 102 have already been explained above. A weighted superimposition of the sensitivity profiles of the antennas 14A, 14B, 14C, 14D ensues in Step 112 to form azimuthally harmonically varying linear combinations similar to the SMASH method (but the SMASH method only relates to spatial harmonics in the phase coding direction). The weighting factors derived from the demand for harmonically varying linear combination are now formed in Step 124 from linear combinations of the reception signals. These linear combinations are entered in Step 126 into k-space of the overall imaging zone, so that k-space is completely filled. In Step 128, the magnetic resonance image is then reconstructed from the completely field k-space either by filtered back-projection or regridding and two-dimensional Fourier transformation. Steps 122 through 128 are implemented in the correspondingly programmed transformation unit 18.

Although modifications and changes may be suggested by those skilled in the art, it is in the intention of the inventors to embody within the patent warranted hereon all changes and modifications as reasonably and properly come within the scope of their contribution to the art.

We claim as our invention:

1. A method for rapidly acquiring a magnetic resonance image comprising the steps of:

providing a radio frequency antenna array composed of a plurality of individual antennas, each of said antennas having a sensitivity, and exciting nuclear spins in an imaging region with said antenna array, and receiving respective resulting magnetic resonance signals simultaneously from said imaging region with said antennas;

conditioning said respective magnetic resonance signals with gradient magnetic fields that define a spatial frequency space having a projection center, and occupying said spatial frequency space with the respective magnetic resonance signals received by said antennas along respective radially directed trajectories proceeding through said projection center in said spatial frequency space;

arranging said antennas in said radio frequency antenna array relative to said projection center, prior to exciting said nuclear spins, at respective positions so that each antenna, dependent on said sensitivity, receives respective magnetic resonance signals which occupy a plurality of said trajectories only sufficient to represent an image of a sub-region of said region, with said antennas being respectively allocated to difference sub-regions that collectively substantially form said imaging region; and transforming the respective magnetic resonance signals from said antennas, dependent on the respective positions of said antennas, to form a magnetic resonance image of said imaging region.

2. A method as claimed in claim 1 wherein the step of transforming the respective magnetic resonance signals comprises Fourier transforming the respective magnetic resonance signals in said spatial frequency space to form a plurality of projections respectively for said antennas, filtering each of said projections to obtain a plurality of filtered projections, back-projecting the respective filtered projections into said imaging region to form a plurality of partial images containing reconstruction artifacts, freeing the respective partial images of said reconstruction artifacts, and superimposing the partial images, freed of said reconstruction artifacts, for all of said antennas to form said magnetic resonance image of said imaging region.

3. A method as claimed in claim 2 comprising assigning respective weights to said partial images and superimposing said partial images according to said weights.

4. A method as claimed in claim 2 comprising superimposing the partial images by quadratic superimposition.

5. A method as claimed in claim 2 comprising normalizing each of said partial images according to the sensitivity profile of the antenna which produced the partial image before superimposing said partial images.

6. A method as claimed in claim 1 wherein the step of transforming the respective magnetic resonance signals comprises, for each plurality of said trajectories representing a respective magnetic resonance signal of an antenna in said spatial frequency space, re-interpolating said plurality of trajectories onto a rectangular grid to obtain gridded trajectories, two-dimensionally Fourier transforming each of said gridded trajectories to obtain a plurality of partial images containing reconstruction artifacts, freeing the respective partial images of said reconstruction artifacts, and superimposing the partial images, freed of said reconstruction artifacts, for all of said antennas to form said magnetic resonance image of said imaging region.

7. A method as claimed in claim 6 comprising assigning respective weights to said partial images and superimposing said partial images according to said weights.

8. A method as claimed in claim 6 comprising superimposing the partial images by quadratic superimposition.

9. A method as claimed in claim 6 comprising normalizing each of said partial images according to the sensitivity profile of the antenna which produced the partial image before superimposing said partial images.

10. A method as claimed in claim 1 wherein the step of transforming the respective magnetic resonance signals comprises Fourier transforming each plurality of said trajectories respectively representing the magnetic resonance signals from the respective antennas to obtain a plurality of projections, shifting said projections to said projection center dependent on the respective position of the antenna which produce the projection, to obtain a plurality of shifted projections, filtering each of said shifted projections to obtain filtered projections, back-projecting the respective filtered projections to obtain a plurality of partial images, and superimposing said partial images at respective locations dependent on the position of the antenna that produce the partial image, for all of said antennas to obtain said magnetic resonance image of said imaging region.

11. A method as claimed in claim 10 comprising assigning respective weights to said partial images and superimposing said partial images according to said weights.

12. A method as claimed in claim 10 comprising superimposing the partial images by quadratic superimposition.

13. A method as claimed in claim 10 comprising normalizing each of said partial images according to the sensitivity profile of the antenna which produced the partial image before superimposing said partial images.

14. A method as claimed in claim 1 wherein the step of transforming the respective magnetic resonance signals comprises re-interpolating each plurality of said trajectories of the respective magnetic resonance signals of the respective antennas onto a rectangular grid to obtain a plurality of gridded trajectories, multiplying the gridded trajectories by respective phase factors defined by the position of the respective antenna which produced the gridded trajectories, reconstructing a plurality of partial images respectively from the gridded trajectories multiplied by the phase factors, and superimposing said partial images at proper locations respectively determined by said phase factors for all of said antennas to form said magnetic resonance image of said imaging region.

15. A method as claimed in claim 14 comprising assigning respective weights to said partial images and superimposing said partial images according to said weights.

16. A method as claimed in claim 14 comprising superimposing the partial images by quadratic superimposition.

17. A method as claimed in claim 14 comprising normalizing each of said partial images according to the sensitivity profile of the antenna which produced the partial image before superimposing said partial images.

18. A method as claimed in claim 1 wherein the step of transforming the respective magnetic resonance signals includes generating a completely occupied spatial frequency space of said imaging region from the respective magnetic resonance signals and the respective sensitivity profiles of said antennas in a linear combination.

19. A method as claimed in claim 1 comprising receiving said respective magnetic resonance signals from circular sub-regions with the respective antennas.

20. A method as claimed in claim 1 comprising receiving the respective magnetic resonance signals from partially overlapping sub-regions with the respective antennas.

21. A method as claimed in claim 1 comprising generating a slice-selective magnetic gradient field to select said imaging region as a slice.

* * * * *